(12) United States Patent
Cordes et al.

(10) Patent No.: US 6,390,439 B1
(45) Date of Patent: May 21, 2002

(54) HYBRID MOLDS FOR MOLTEN SOLDER SCREENING PROCESS

(75) Inventors: Steven A. Cordes, Cortlandt Manor, NY (US); David Hirsch Danovitch, Quebec (CA); Peter Alfred Gruber, Mohegan Lake, NY (US); James Louis Speidell, Poughquaq, NY (US); Joseph Peter Zinter, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/287,370

(22) Filed: Apr. 7, 1999

(51) Int. Cl.⁷ .......................... B29C 33/00; B23K 35/12
(52) U.S. Cl. ................ 249/119; 249/134; 249/139; 156/60; 264/219; 216/79; 216/99
(58) Field of Search ............................ 249/119, 134, 249/139; 264/219; 156/60; 216/79, 99

(56) References Cited

U.S. PATENT DOCUMENTS

| | | | | |
|---|---|---|---|---|
| 5,219,117 A | * | 6/1993 | Lin .............................. 228/253 |
| 5,381,848 A | * | 1/1995 | Trabucco .................... 164/102 |
| 5,586,715 A | * | 12/1996 | Schwiebert et al. ..... 228/248.1 |
| 5,673,846 A | * | 10/1997 | Gruber .................. 228/180.22 |
| 5,718,361 A | * | 2/1998 | Braun et al. ............... 228/56.3 |
| 5,718,367 A | * | 2/1998 | Covell, II et al. .......... 228/254 |
| 5,961,032 A | * | 10/1999 | Covell, II et al. .......... 228/254 |
| 6,024,275 A | * | 2/2000 | Takiar .................... 228/180.22 |
| 6,149,122 A | * | 11/2000 | Berger et al. ................ 249/119 |

\* cited by examiner

*Primary Examiner*—James P. Mackey
(74) *Attorney, Agent, or Firm*—Robert M. Trepp; Randy W. Tung

(57) ABSTRACT

Hybrid molds for molding a multiplicity of solder balls for use in a molten solder screening process and methods for preparing such molds are disclosed. A method for forming the multiplicity of cavities in a pyramidal shape by anisotropically etching a crystalline silicon substrate along a specific crystallographic plane is utilized to form a crystalline silicon face plate used in the present invention hybrid mold. In a preferred embodiment, a silicon face plate is bonded to a borosilicate glass backing plate by adhesive means in a method that ensures coplanarity is achieved between the top surfaces of the silicon face plate and the glass backing plate. In an alternate embodiment, an additional glass frame is used for bonding a silicon face plate to a glass backing plate, again with ensured coplanarity between the top surfaces of the silicon face plate and the glass frame. In a second alternate embodiment, a silicon face plate is encased in an extender material which may be borosilicate glass or a polymer. The encasing is performed on a leveling fixture such that the top surface of the silicon face plate and the top surface of the extender material after solidification are perfectly leveled.

40 Claims, 6 Drawing Sheets

HYBRID MOLDS FOR MOLTEN SOLDER SCREENING PROCESS

FIELD OF THE INVENTION

The present invention generally relates to hybrid molds for use in a molten solder screening process for molding solder bumps and methods for preparing such molds and more particularly, relates to hybrid molds for molding a multiplicity of solder balls which are constructed by a crystalline silicon face plate provided with a multiplicity of cavities formed in a front surface and a rigid backing plate which has substantially the same coefficient of thermal expansion as crystalline silicon for bonding to a back surface of the face plate and methods for preparing such hybrid molds.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by an evaporation method of lead and tin through a mask for producing the desired solder balls. More recently, the technique of electro-deposition has been used to produce solder balls in flip-chip packaging.

Other solder ball formation techniques that are capable of solder-bumping a variety of substrates have also been proposed. These techniques work fairly well in bumping semiconductor substrates that contain solder structures over a minimum size. One of the more popularly used techniques is a solder paste screening technique which can be used to cover the entire area of an 8 inch wafer. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself. A paste is generally composed of a flux and solder alloy particles. The consistency and uniformity of the solder paste composition become more difficult to control with a decreasing solder bump volume. A possible solution for this problem is the utilization of solder pastes that contain extremely small and uniform solder particles. However, this can only be done at a high cost penalty. Another problem in using the solder paste screening technique in modern high density devices is the reduced pitch between bumps. Since there is a large reduction in volume from a screened paste to the resulting solder bump, the screen holes must be significantly larger in diameter than the final bumps. The stringent dimensional control of the bumps makes the solder paste screening technique impractical for applications in high density devices.

A more recently developed injection molded solder (IMS) technique attempted to solve these problems by dispensing molten solder instead of solder paste. However, problems have been observed when the technique is implemented to wafer-sized substrates. U.S. Pat. No. 5,244,143, discloses the injection molded solder technique and is hereby incorporated by reference in its entirety. One of the advantages of the IMS technique is that there is very little volume change between the molten solder and the resulting solder bump.

The IMS technique utilizes a two inch wide head that fills boro-silicate glass molds that are wide enough to cover most single chip modules. A narrow wiper provided behind the solder slot passes the filled holes once to remove excess solder. The IMS method for solder bonding is then carried out by applying a molten solder to a substrate in a transfer process. When smaller substrates, i.e., chip scale or single chip modules (SCM's) are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped.

A more recently developed method that does not have the limitations of the solder paste screening technique of significant volume reductions between the initial paste and the final solder volume is the molten solder screening (MSS) method. In the MSS method, pure molten solder is dispensed. When the MSS solder-bumping method is used on large substrates such as 8 inch or 12 inch wafers, surface tension alone is insufficient to maintain intimate contact between a mold and a substrate. In order to facilitate the required abutting contact over large surface areas, a new method and apparatus for maintaining such are therefore necessary.

For instance, in a co-pending application of Ser. No. 09/070,121 commonly assigned to the Assignee of the present application and is hereby incorporated by reference in its entirety, a method for forming solder bumps by a MSS technique that does not have the drawbacks or shortcomings of the conventional solder bumping techniques has been proposed. In the method, a flexible die member is used in combination with a pressure means to enable the die member to intimately engage a mold surface and thus filling the mold cavities and forming the solder bumps. The flexible die head also serves the function of a wiper by using a trailing edge for removing excess molten solder from the surface of the mold.

The MSS process can be carried out by first filling a multiplicity of cavities in the surface of a mold with molten solder. This is accomplished by first providing a stream of molten solder and then passing a multiplicity of cavities in the mold surface in contact with the surface of the stream while adjusting a contact force such that the molten solder exerts a pressure against the surface of the mold to fill the cavities with solder and to remove excess solder from the surface of the mold. The stream of molten solder is supplied through a die head constructed of a flexible metal sheet that is capable of flexing at least 0.0015" per inch of the die length. The solder has a composition between about 58% tin/42% lead and about 68% tin/32% lead. The multiplicity of cavities each has a depth-to-width aspect ratio of between about 1:1 and about 1:10. The mold body is made of a material that has a coefficient of thermal expansion substantially similar to that of silicon or the final solder receiving material. The contact between the multiplicity of cavities and the surface of the molten solder stream can be adjusted by a pressure means exerted on the flexible die.

Referring now to FIG. 1A, wherein a flexible die head 10 for forming solder bumps by a molten solder screening process is shown. The die head 10 has a die body 12 which is made of a thin, flexible metal sheet such as stainless steel or any other suitable material that is non-wetting to solder. The die body 12 has a gate opening 14 and a slot opening 16. The gate opening 14 has a narrow width and is generally positioned at the center of the die body 12. The gate opening 14 provides fluid communication between a front side 18 and a back side 22 of the die body 12. The gate opening 14 further provides a passageway for receiving a molten solder 24 stored in a solder reservoir 26. The molten solder 24 is kept under an inert gas atmosphere at a pressure of approximately 5 psi. A suitable inert gas used is nitrogen, i.e., as shown in FIG. 1A, supplied by a nitrogen source 28. The functions of the inert gas in the solder reservoir are two fold. First, it provides an inert gas blanket over the solder 24 such that any oxidation of the molten solder 24 can be avoided. Secondly, the nitrogen blanket in the reservoir 26 provides a positive pressure such that molten solder 24 flows easily through the gate opening 14 into the slot opening 16. In continuous operation, the nitrogen pressure is turned off when flexible die head 10 moves between molds to prevent solder loss. The slot opening 16 is provided in the front surface 18 of the die body 12 in a suitable depth such that molten solder 24 can easily flown into the mold cavities 32 (shown in FIG. 2). The width of the slot opening 16 is predetermined such that it covers substantially all the cavities 32, 38 in the mold surface 42. The opening 16 is also wide enough to cover the entire width of a wafer surface to be later bumped by first filling a mold surface having the same width.

The die body 12 also functions as a high temperature squeegee which separates the molten solder in the slot opening 16 from the molten solder filled in the mold cavities 32 (FIG. 2). In order to accomplish this task, the die body 12 must be positioned closely behind a molten solder flow front when the flow front completely covers a linear area across the mold surface 42. The aspect ratio (the depth-to-width ratio) of the mold cavities 32 are typically 0.5 so that solder flows easily into and penetrates to the bottom of the cavity. It has been noted that, at this point, it is critical to "cut" or "sever" the molten solder as the mold plate 34 scans over the molten solder flow. This difficult task is accomplished by the flexible die body 12 in a unique manner since the trailing edge 36 of the die body 12 functions as a flexible wiper, or squeegee, to continuously scrape the surface 42 of the mold plate 34. FIG. 1B illustrates a bottom view of the flexible die head 10 shown in FIG. 1A. The trailing edge 36 of the die body 12 therefore effectively "cuts" the solder supply 24 from the molten solder that has already been deposited in the mold cavities 32. The trailing edge 36, should be sufficiently smooth to assure a uniform contact across the optically-smooth mold surface 42. It is another unique feature that the trailing edge 36, or the wiper, of the die body 12 is flexible only on a global scale, i.e. on a scale of the width of the mold plate 34. As a result, the trailing edge 36 does not enter into cavities 32 and damage the solder bumps formed in the cavities. The word "flexibility" used in the context of the application is on the scale of inches, while the word "rigidity" used in the context is on the scale of thousandths of an inch or mils.

As shown in FIG. 2, the flexible die body 12 scans smoothly over the surface 42 of the mold plate 34, i.e., over the top of all the cavities 32 allowing the solder within the cavities to stay while removing excess solder from the surface 42. This operation continues as the mold plate 34 is scanned over the molten solder supply 24 until all the cavities are filled. As shown in FIG. 2, the cavities 38 not yet scanned over die body 12 are still empty. The method only requires the die body 12 to pass over the mold plate 34 once for a complete fill. The novel process therefore eliminates solder streaking and non-uniform fill problems caused by multiple scannings with overlapped areas encountered in conventional methods.

The MSS method is therefore a new technique for solder bumping large 8 inch or even 12 inch silicon wafers. As previously described, the technique basically involves filling cavities in wafer-sized mold plates with molten solder, solidifying the solder and then transferring the solder in these cavities to the wafer. The transfer process requires aligning the cavities in a mold plate to the solder receiving pads on a silicon wafer and then heating the assembly to a solder reflow temperature. This results in the molten solder to metallurgically bond to the metallized pads on the wafer and thus assuring the solder in each cavity to transfer from the mold plate to the wafer. Since various solder alloys are readily processed with the MSS technique, the mold plate and wafer assembly must remain aligned throughout the reflow process. Since the contact area between mold plate and wafer covers an entire 8 inch or 12 inch silicon wafer, it is important that these materials match very closely in coefficient of thermal expansion (CTE), for instance, when the mold plate is fabricated of a borosilicate glass.

In another copending application assigned to the common assignee of the present invention, Ser. No. 09/109,396, a process for etching a glass mold plate is disclosed for producing the desired cavities in a mold for receiving molten solder. However, since glass is an amorphous material, processing parameters which control the isotropic etching must be carefully monitored to produce the desired cavity volumes. Even when such control is possible, the resulting cavity has a flat bottom with curved sidewalls which allows the reflowed solder ball certain degree of lateral movement before bonding to the solder receiving pad on a wafer or any other electronic substrates. It is desirable to eliminate any possibility of such lateral movement such that highest accuracy of ball location during the reflow process can be maintained.

It is therefore desirable to provide cavities for solder balls that are not hemispherical in shape such that the location of the solder ball can be controlled more accurately. Since the substrate that typically receives solder bumps is an 8 inch round silicon wafer, the corresponding hole pattern in the mold plate is also circular. It is known that the MSS head has a solder slot which is slightly greater than the diameter of the circular hole pattern, i.e., about 8 inches, thus a run-on and run-off area is required at the beginning and at the end of the scan length. For instance, this is so when the mold is a 10"×10" square borosilicate glass plate which has an 8 inch circular hole pattern etched therein. However, when the mold plate is made of an 8 inch anistropically etched <100> silicon wafer, there is no run-on or run-off area, since the wafer diameter is only slightly larger than the circular hole pattern area. Thus, there is a need to square-off a round silicon wafer mold plate to provide the peripheral area needed by a MSS solder head. Even though it is possible to take a larger 12 inch round <100> silicon wafer and etch a central 8 inch area to produce the hole pattern to bump an 8 inch silicon wafer, it is undesirable for several reasons. First, since silicon wafers are crystalline material, they are sensitive to defects in the crystal which may initiate and propagate cracks. Secondly, since the MSS process subjects the <100> silicon mold plate to mechanical stress, standard ratios of wafer diameter-to-thickness would be insufficient to prevent possible fatigue cracking. Furthermore, if the wafer to be bumped was 12 inch in diameter, then an even larger, i.e., 16 inch diameter mold plate wafer would be required. As a consequence, the largest manufactured silicon wafer could not be bumped by a silicon-only mold plate.

It is therefore an object of the present invention to provide a hybrid mold for molding a multiplicity of solder balls that does not have the drawbacks or shortcomings of the conventional molds.

It is another object of the present invention to provide a hybrid mold for molding a multiplicity of solder balls that consists of a crystalline silicon face plate and a backing plate bonded to the face plate.

It is a further object of the present invention to provide hybrid mold for molding a multiplicity of solder balls wherein a crystalline silicon face plate is utilized by etching in its surface along a crystallographic orientation a multiplicity of cavities.

It is another further object of the present invention to provide a hybrid mold for molding a multiplicity of solder balls wherein a multiplicity of cavities are formed in a front surface of a crystalline silicon face plate with each of the cavities being a pyramidal shape.

It is still another object of the present invention to provide a hybrid mold for molding a multiplicity of solder balls wherein a crystalline silicon face plate and a backing plate made of a material having a rigidity and a coefficient of thermal expansion substantially similar to that of the crystalline silicon are used.

It is yet another object of the present invention to provide a hybrid mold for a multiplicity of solder balls by etching a multiplicity of cavities in a crystalline material in an anisotropic etching process thus eliminating the need for the careful monitoring of processing parameters since the crystallographic nature of the crystalline material determines the etching geometries.

It is still another further object of the present invention to provide a hybrid mold for a multiplicity of solder balls by bonding a crystalline silicon face plate to a borosilicate glass backing plate by an adhesive means.

It is yet another further object of the present invention to provide a hybrid mold for a multiplicity of solder balls by bonding a crystalline silicon face plate to a borosilicate glass backing plate such that the crystalline silicon face plate has a coefficient of thermal expansion substantially similar to that for the electronic substrate onto which the multiplicity of solder balls are transferred.

It is still another further object of the present invention to provide a hybrid mold for a multiplicity of solder balls by bonding a crystalline silicon face plate that has a multiplicity of cavities formed in a front surface to a borosilicate glass backing plate such that the front surface of the face plate and a top surface of the backing plate are coplanar.

SUMMARY OF THE INVENTION

In accordance with the present invention, a hybrid mold for a multiplicity of solder balls and a method for preparing such hybrid mold are disclosed.

In a preferred embodiment, a hybrid mold for a multiplicity of solder balls is provided which includes a crystalline silicon face plate that has a multiplicity of cavities formed in a front surface and a backing plate bonded to a back surface of the face plate. The multiplicity of cavities in the front surface of the crystalline silicon face plate is formed along a crystallographic orientation, such as <100>. Each of the multiplicity of cavities may have a pyramidal shape. The mold can be used to transfer solder balls to an electronic substrate in a molten solder screening process.

The backing plate of the hybrid mold may have a rigidity that is substantially similar to that of the crystalline silicon. The backing plate may further have a coefficient of thermal expansion substantially similar to that of the crystalline silicon, i.e., a coefficient of thermal expansion within 50% of that for the crystalline silicon. The backing plate may be formed of a ceramic such as glass. The backing plate may be formed of borosilicate glass. The backing plate of the hybrid mold may further be formed of a polymer which has a rigidity similar to that for the crystalline silicon. The backing plate may be bonded to the face plate by adhesive means, or by a thermal ionic means, such as Mallory® bonding. The backing plate may also be formed by casting a molten glass around the face plate or by casting a flowable polymer around the face plate. The backing plate may further be bonded to the face plate by a polymeric based adhesive. The crystalline silicon face plate has a coefficient of thermal expansion that is substantially similar to that for the electronic substrate onto which the multiplicity of solder balls are transferred.

The present invention is further directed to a hybrid mold for a multiplicity of solder balls that includes a crystalline silicon face plate which has a substantially parallel front surface and back surface, a multiplicity of cavities for forming solder in the front surface of the face plate, and a backing plate which has a top surface and a bottom surface, the top surface has a recess formed therein for receiving the face plate by adhesive means such that the front surface of the face plate and the top surface of the backing plate are substantially coplanar.

The multiplicity of cavities for forming solder balls in the hybrid mold are formed along a preselected crystallographic orientation, such as an orientation of <100>. Each of the multiplicity of cavities may have a pyramidal shape. The recess in the top surface of the backing plate has an area and a depth sufficiently large for receiving the face plate such that the front surface of the face plate and the top surface of the backing plate are coplanar when the face plate is bonded to the recess by an adhesive layer. The backing plate may be formed of a material that has a rigidity and coefficient of thermal expansion substantially similar to those for crystalline silicon. The backing plate may be formed of borosilicate glass.

The present invention is further directed to a hybrid mold for a multiplicity of solder balls that includes a crystalline silicon face plate which has a first diameter and a multiplicity of cavities formed in a front surface, a backing plate which has a top surface bonded to a back surface of the face plate, the backing plate has a length and a width larger than the first diameter of the face plate, a frame member which has substantially the same length and width as the backing plate and an aperture having a second diameter larger than the first diameter of the face plate, and an adhesive circumferentially bonding the frame member to the face plate such that a top surface of the frame member is coplanar with the front surface of the face plate.

The hybrid mold may further include an adhesive layer between a bottom surface of the frame member and a top surface of the backing plate. The frame member and the backing plate may be formed substantially of the same material. The frame member and the backing plate may be formed of a material that has a rigidity substantially similar to that of crystalline silicon. The frame member and the backing plate may be formed of a material which has a coefficient of thermal expansion within 50% of that for the crystalline silicon. A thermal ionic bond may exist between the top surface of the backing plate and the back surface of the face plate. The multiplicity of cavities are formed in the crystalline silicon along a crystallographic orientation of <100>. Each of the multiplicity of cavities in the hybrid mold may be formed in a pyramidal shape.

The present invention is still further directed to a hybrid mold for a multiplicity of solder balls which consists of a crystalline silicon face plate having a multiplicity of cavities formed in a front surface, and a backing plate encasing the face plate with the front surface of the face plate exposed and a top surface of the backing plate being substantially coplanar with the front surface of the face plate.

The backing plate of the hybrid mold may be formed of a material that has a rigidity and a coefficient of thermal expansion substantially similar to those of the crystalline silicon. The multiplicity of cavities may be formed in the crystalline silicon along a crystallographic orientation of <100>. The backing plate of the hybrid mold may be formed of borosilicate glass or of a polymeric material.

The present invention is still further directed to a method for preparing a hybrid mold for a multiplicity of solder balls which can be carried out by the operating steps of first providing a crystalline silicon face plate that has a multiplicity of cavities formed in a front surface, and then bonding a backing plate to a back surface of the face plate.

The method may further include the step of forming a multiplicity of cavities in the front surface of the crystalline silicon plate along a crystallographic orientation of <100>. Each of the multiplicity of cavities may be formed in a pyramidal shape. The method may further include the step of transferring a multiplicity of solder balls to an electronic substrate in a molten solder screening process. The method may further include the step of forming the backing plate with a material which has a rigidity or coefficient of thermal expansion substantially similar to that of the crystalline silicon.

The method for preparing a hybrid mold may further include the step of forming the backing plate with a ceramic or a glass, bonding the backing plate to a back surface of a face plate by adhesive means, or bonding the backing plate to the back surface of the face plate by a thermal ionic means. The method may further include the step of forming the backing plate by casting a molten glass or a flowable polymer around the face plate. The method may further include the step of bonding the backing plate to the face plate by a polymeric based adhesive.

The present invention is further directed to a method for preparing a hybrid mold for a multiplicity of solder balls by the operating steps of first providing a crystalline silicon face plate which has a substantially parallel front surface and back surface, then etching a multiplicity of cavities for forming solder balls in the front surface of the face plate, then providing a backing plate which has a top surface and a bottom surface, the top surface has a recess formed therein, and bonding the back surface of the face plate into the recess such that the front surface of the face plate and the top surface of the backing plate are substantially coplanar.

The method for preparing a hybrid mold may further include the step of forming the multiplicity of cavities in the front surface of the face plate along a preselected crystallographic orientation of <100>. The method may further include the step of etching each of the multiplicity of cavities in a pyramidal shape, providing the recess in the top surface of the backing plate with an area and a depth sufficient for receiving the face plate, and forming the backing plate with a material that has a rigidity and coefficient of thermal expansion substantially similar to those of crystalline silicon. The method may further include the step of forming the backing plate with borosilicate glass.

The present invention is still further directed to a method for preparing a hybrid mold for a multiplicity of solder balls by the steps of first providing a crystalline silicon face plate that has a first diameter and a multiplicity of cavities formed in a front surface, then providing a backing plate which has a top surface bonded to a back surface of the face plate, the backing plate has a length and a width larger than the first diameter of the face plate, then providing a frame member which has substantially the same length and width as the backing plate and an aperture with a second diameter larger than the first diameter of the face plate, and bonding an outer peripheral surface of the face plate to an inner peripheral surface of the frame member by an adhesive means such that a top surface of the frame member is coplanar with the front surface of the face plate.

The method for preparing a hybrid mold may further include the step of adhesively bonding a bottom surface of the frame member to a top surface of the backing plate, forming the frame member and the backing plate with substantially the same ceramic material, and forming the frame member and the backing plate with a material that has a rigidity and coefficient of thermal expansion substantially similar to those of crystalline silicon.

The method for preparing a hybrid mold may further include the step of forming the frame member and the backing plate with a material that has a coefficient of thermal expansion within 50% of that for the crystalline silicon. The method may further include the step of bonding the top surface of the backing plate and the back surface of the face plate by a thermal ionic bonding method, etching a multiplicity of cavities in the front surface of the crystalline silicon face plate along a crystallographic orientation of <100>, and etching each of the multiplicity of cavities in the front surface of the crystalline silicon face plate in a pyramidal shape.

The present invention is still further directed to a method for preparing a hybrid mold for a multiplicity of solder balls which can be carried out by the operating steps of first providing a crystalline silicon face plate with a front surface and a back surface, etching a multiplicity of cavities for the solder balls in the front surface, and encasing the face plate with a liquid material forming a backing plate wherein the front surface of the face plate is exposed and the top surface of the backing plate is substantially coplanar with the front surface of the face plate. The method may further include the step of forming the backing plate with a material that has a rigidity and a coefficient of thermal expansion after solidifying that are substantially similar to those for the crystalline silicon. The method may further include the step of etching each of the multiplicity of cavities in the face plate along a crystallographic orientation of <100>. The method may further include the step of forming the backing plate with borosilicate glass or a polymeric material.

The present invention is still further directed to a method for molding a multiplicity of solder balls in a hybrid mold which can be carried out by the operating steps of first providing a crystalline silicon face plate that has a front surface and a back surface substantially parallel to each other, etching a multiplicity of cavities in the front surface of the face plate, bonding a backing plate to the back surface of the face surface, and then filling the multiplicity of cavities with a molten solder. The method may further include the step of etching the multiplicity of cavities in the crystalline silicon face plate along a crystallographic orientation of <100>.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a novel hybrid mold for molding a multiplicity of solder balls which is constructed by a face plate made of a crystalline silicon and formed with a multiplicity of cavities of pyramidal shape, and a backing plate that has a rigidity and coefficient of thermal expansion substantially similar to that of the crystalline silicon. The present invention further discloses a method for preparing such hybrid molds in a preferred and two alternate embodiments. The present invention hybrid molds can be used for any semiconductor processes which require the use of solder balls, but is particularly suitable for use in a molten solder screening process for preparing solder balls.

One of the novel features of the present invention is the use of a crystalline silicon face plate for forming the multiplicity of cavities along a specific crystallographic orientation of the silicon. As a result, a multiplicity of cavities each having a pyramidal shape can be formed along a crystallographic plane of <100> such that any lateral movement of a solder ball in its cavity can be minimized or eliminated. The highest accuracy of solder ball location during a reflow process can thus be obtained. Furthermore, since the crystalline silicon is anisotropically etched to produce the multiplicity of cavities in a front surface, the need for careful monitoring of the processing parameters is eliminated due to the crystallographic nature of the bulk material which determines the etching planes and affords a self-limiting process.

Figure 1A:
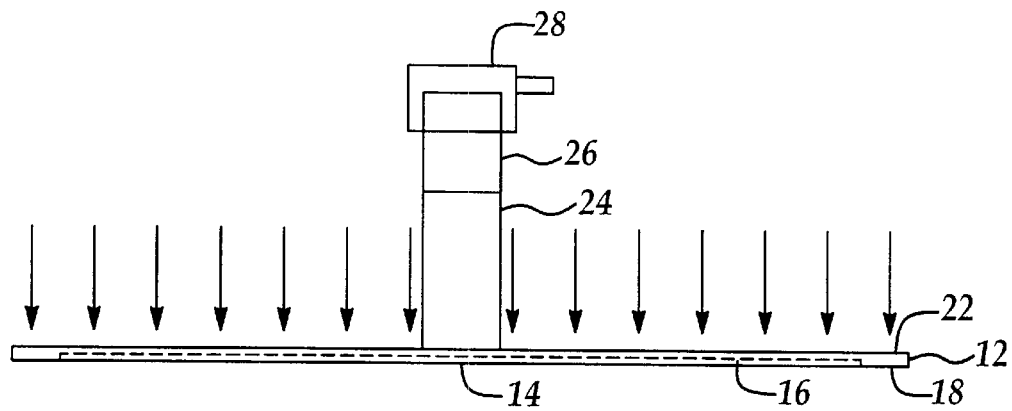
FIG. 1A is a schematic illustrating a side view of a flexible die head used in a molten solder screening process.
Figure 1B:
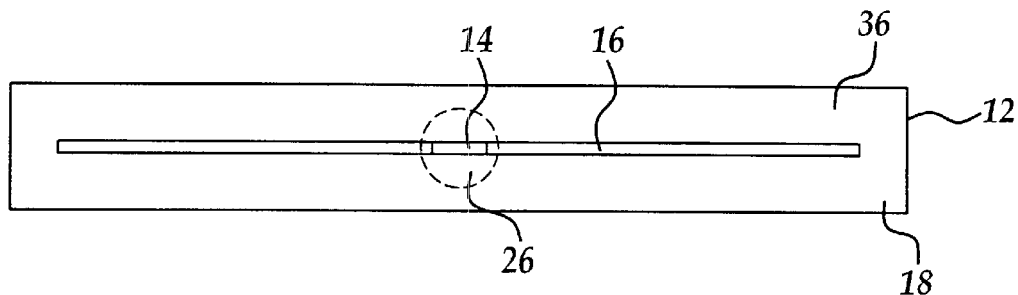
FIG. 1B is a schematic illustrating a bottom view of the flexible die head of FIG. 1A.
Figure 2:
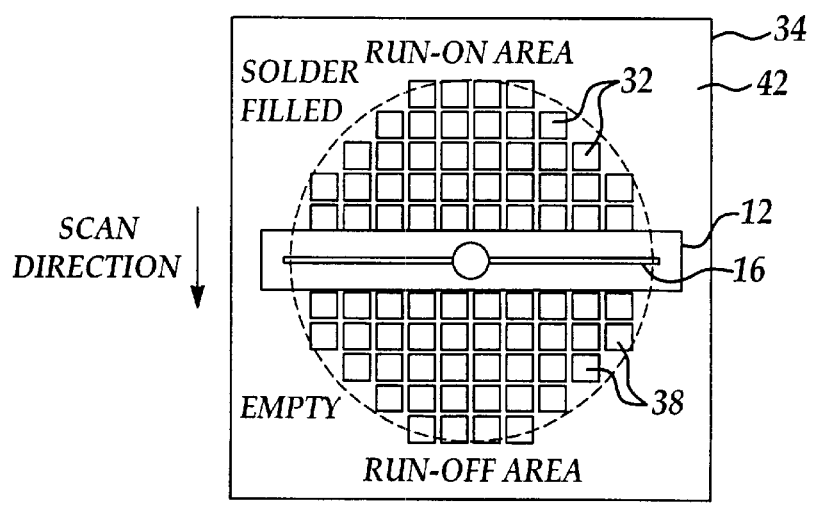
FIG. 2 is a schematic illustrating a die head positioned over a wafer-sized mold in a molten solder screening process.
Figure 2A:
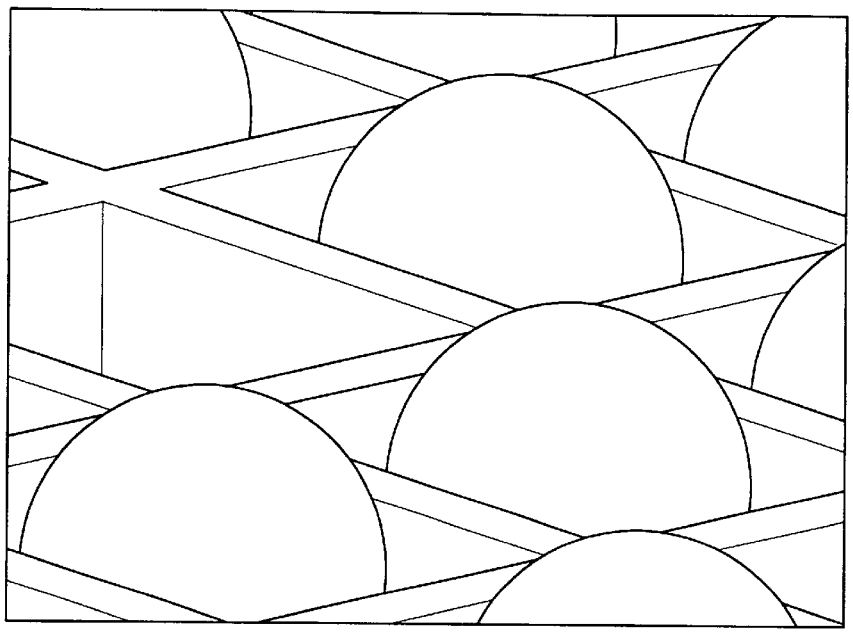
FIG. 2A is a schematic illustrating an enlarged perspective view of solder balls situated in mold cavities after a solder reflow process.
Figure 2B:
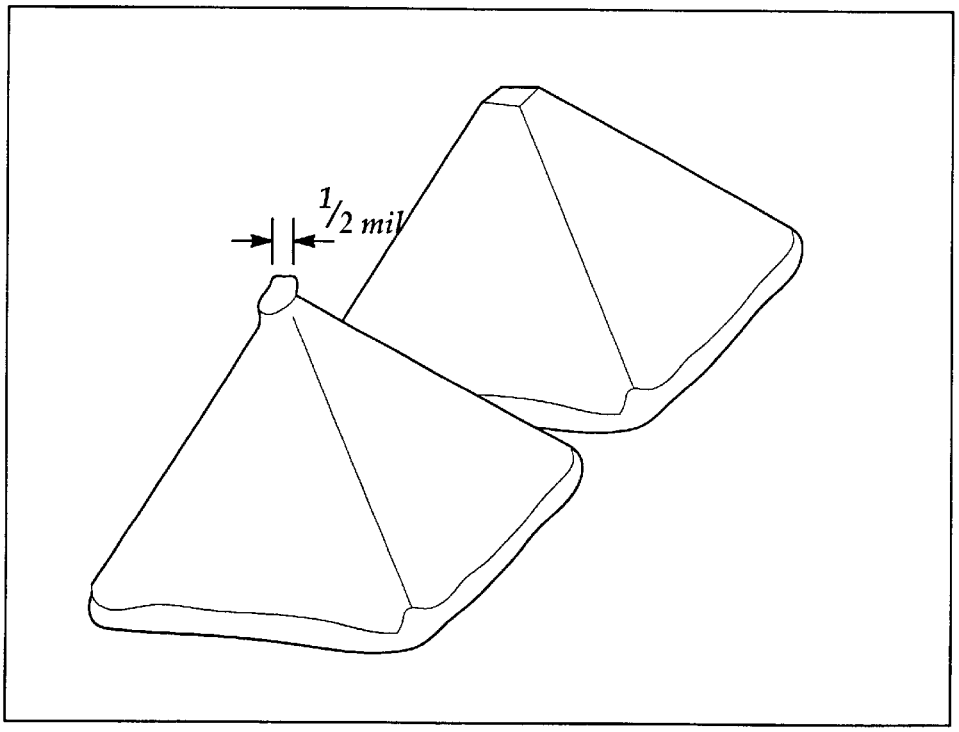
FIG. 2B is a schematic illustrating a perspective view of the pyramidal shape of the cavities in the crystalline silicon mold.

The present invention permits the making of a wafer-sized solder mold of crystalline silicon material by anisotropically etching the single crystal silicon wafer along a crystallographic orientation of <100>. By using this process, pyramidal shaped cavities are produced which assure that upon reflow the solder balls stay on exact centers determined by the apex of the pyramid. This is shown in FIGS. 2A and 2B. The pyramidal shape of the cavity (FIG. 2B) causes the reflowed solder ball to protrude significantly above the mold plate surface (FIG. 2A). This configuration assures that the molten solder contacts the metalized bonding pad on the wafer during the reflow process, since surface tension in effect lifts the solder out of the cavity onto the pad. As the wafer is held in intimate contact with the mold plate during the reflow process, wetting of the solder to the pads takes place as soon as the lifting process begins at the reflow temperature. Another novel feature of the present invention method of anisotropically etching of the <100> silicon is that the method provides easy control of high precision pyramidal mold cavities which are extremely uniform as repetitive arrays across a silicon mold plate. This is accomplished due to the fact that directional etch rates are controlled mainly by the various crystallographic planes of the bulk silicon material. Defect densities are also significantly lower than in amorphous borosilicate glass.

Another novel feature of the present invention hybrid mold is the use of the crystalline silicon face plate for the hybrid mold since the silicon face plate is completely matched in CTE to a wafer silicon. This assures that there will be no shifting in alignment between the mold plate (the silicon face plate) and the wafer when the assembly is elevated from room temperature to a solder reflow temperature.

Still another novel feature of the present invention hybrid mold utilizing a crystalline silicon face plate is the contrast provided between cavities that are empty and those that are filled with solder. Since silicon is a dark material and solder is a brightly reflective metal, a strong contrast is presented which is useful for inspecting the mold to assure that all of the cavities have been filled with solder during the MSS process. Since the present invention novel method enables an effective transfer process of the solder balls, a 100% filled mold results in a 100% bumped wafer.

Even though silicon is not transparent in the visible light spectron, it is transparent in the infra-red portion of the spectrum. Therefore, a solder filled silicon mold may be aligned to the wafer in the infra-red or by a commonly used split-optics alignment technique.

The present invention novel hybrid molds combined a crystalline silicon face plate with a backing plate or a glass frame thus forming a hybrid mold fixture. In the following preferred and alternate embodiments, a desirable common feature is shared which matches the solder receiving or electronic wafer diameter to the silicon face plate diameter. In effect, an 8 inch silicon face plate will bump an 8 inch silicon wafer, while a 12 inch silicon face plate will bump a 12 inch silicon wafer.

Figure 3:
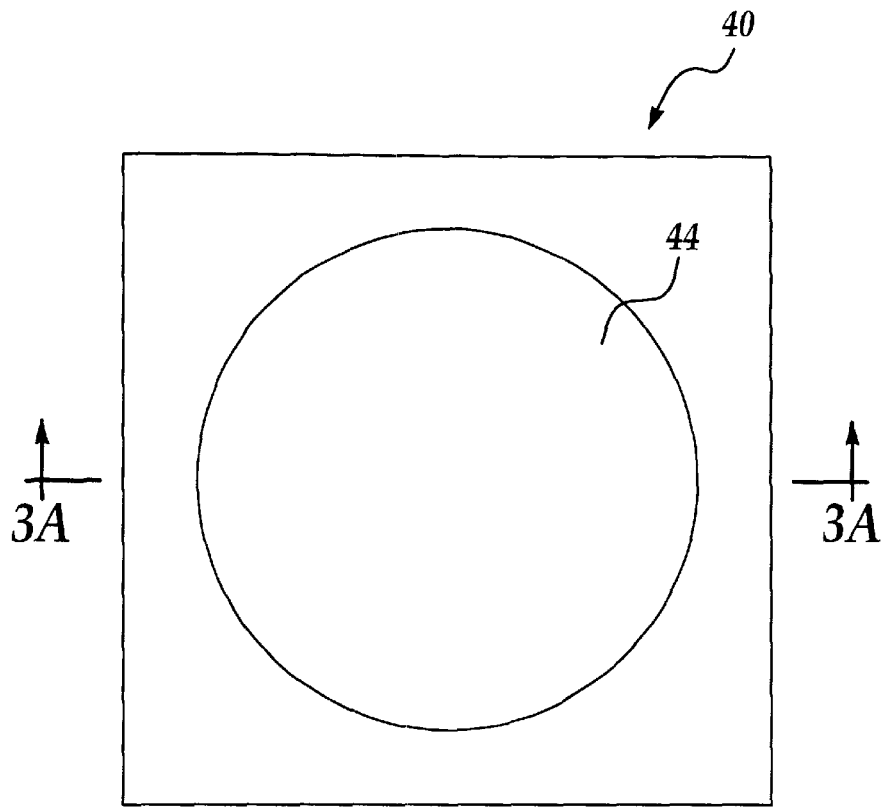
FIG. 3 is a plane view of a present invention backing plate.
Figure 3A:
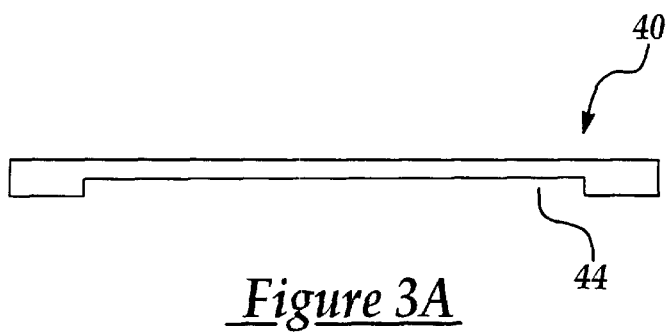
FIG. 3A is a side view of the backing plate of FIG. 3 in a one-piece construction.
Figure 3B:
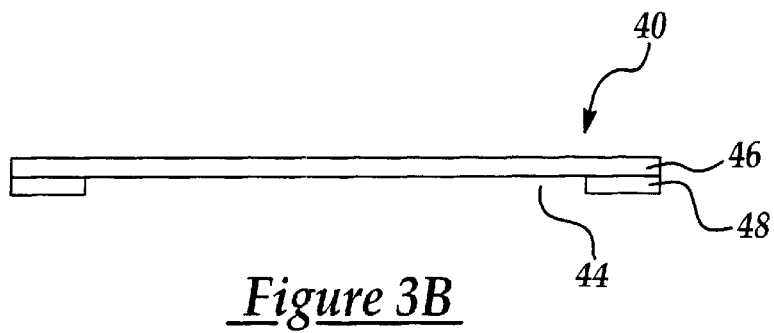
FIG. 3B is a side view of the backing plate of FIG. 3 in a two-piece construction.

Referring now to FIG. 3, wherein a plane view of a preferred embodiment of the present invention backing plate 40 is shown. The backing plate 40 may be a 10"×10" borosilicate glass plate in which a large circular cavity 44 has been produced and thus becoming a glass frame. This may be accomplished by either taking a single glass plate and machining or etching a cavity to a depth slightly greater than the thickness of the silicon face plate, or joining two flat glass plates with one of which has a central cavity 44 cut out and is slightly thicker than the silicon face plate. These are shown in FIGS. 3A and 3B. FIG. 3A shows a single piece construction, while FIG. 3B shows a two-piece construction of a base plate 46 and a glass frame 48 with a cavity 44.

Figure 4:
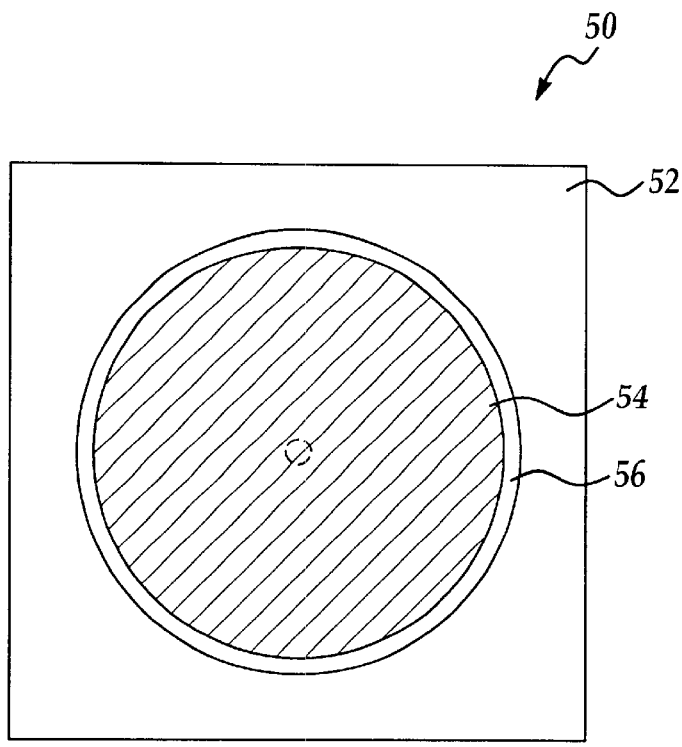
FIG. 4 is a plane view of the preferred embodiment of the present invention hybrid mold.
Figure 4A:
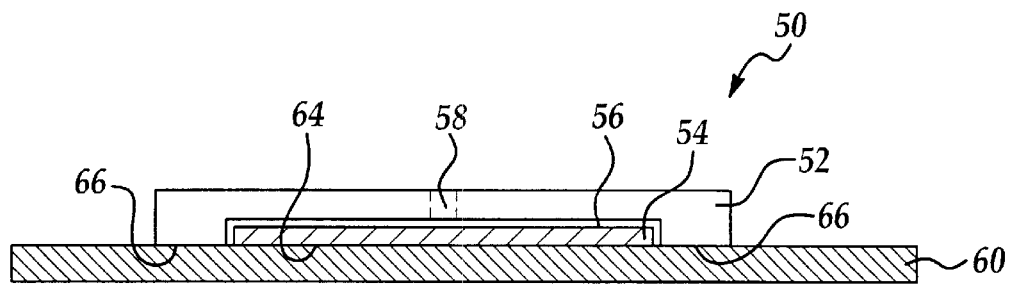
FIG. 4A is a cross-sectional view of the present invention preferred embodiment of FIG. 4 illustrating a crystalline silicon face plate and a borosilicate backing plate positioned on a leveling fixture.
Figure 4B:
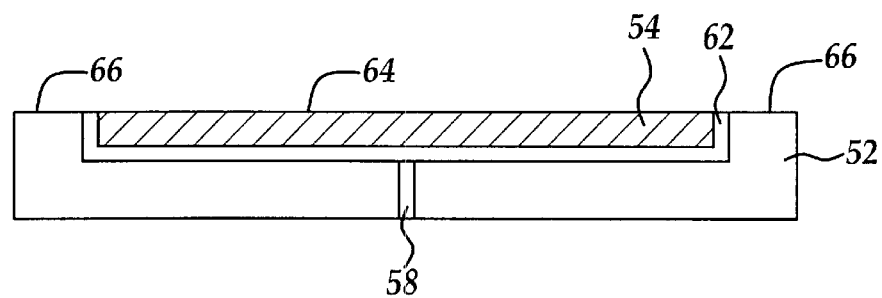
FIG. 4B is a cross-sectional view of a completed hybrid mold in the present invention preferred embodiment wherein a polymeric adhesive bonds the face plate and the backing plate together.

The present invention preferred embodiment hybrid mold is further shown in FIGS. 4, 4A and 4B. As shown in FIG. 4, a plane view of the present invention hybrid mold 50 is shown with a backing plate 52, a crystalline silicon face plate 54 and a gap 56 formed between the backing plate and the face plate. As shown in FIG. 4A, the silicon face plate 54 and the glass backing plate 52 are placed in a face-down position on a leveling fixture 60 which is equipped with vacuum. The leveling fixture 60 provides a top-reference for the assembly of the face plate 54 and the backing plate 52 and thus assuring the top surface 64 of the face plate 54 and the top surface 66 of the backing plate 52 are on exactly the same plane. Vacuum ports (not shown) on the leveling fixture 60 are positioned such that they contact both the face plate 54 and the backing plate 52 for holding both down securely.

As shown in FIG. 4A, the assembly of the face plate 54 and the backing plate 52 is positioned upside down such that the top surface 64 of the face plate 54 and the top surface 66 of the backing plate 52 are both facing toward the leveling fixture 60. The backing plate 52 is also provided with an aperture 58 through its thickness for injecting a liquid polymer 62 such as a polyimide into the gap 56 formed between the two plates. The liquid polymer 62 is injected until it completely fills the gap 56 and begins to leak out along the outer edge of the gap. The hybrid mold assembly 50 is then heated in an oven to cure the liquid polymer and to produce a gap-filling bond which holds the silicon face plate 54 securely in the glass backing plate 52. After the polymer curing process, the hybrid mold assembly is released from the leveling fixture 60 and excess polymer around the silicon face plate may be trimmed off by mechanical means. A present invention novel hybrid mold which has an absolutely planar face plate-backing plate arrangement can be used for filling solder and preparing solder balls.

Figure 5:
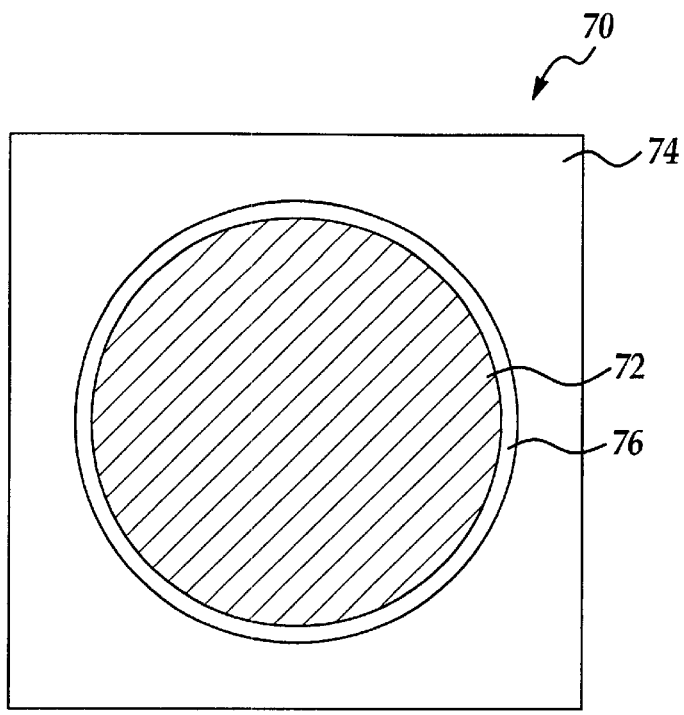
FIG. 5 is a plane view of an alternate embodiment of the present invention.
Figure 5A:
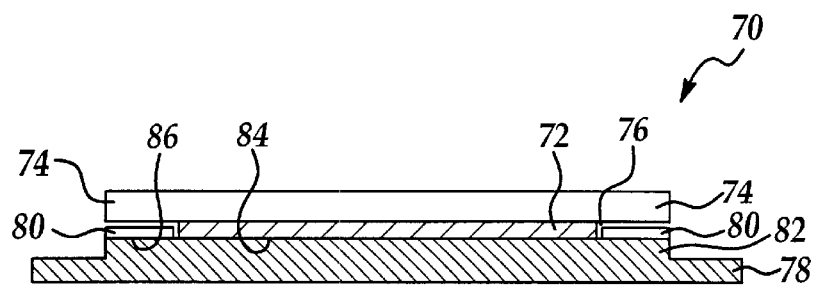
FIG. 5A is a cross-sectional view of the alternate embodiment of FIG. 5 illustrating a crystalline silicon face plate which is bonded to a backing plate and a frame member positioned on a leveling fixture.
Figure 5B:
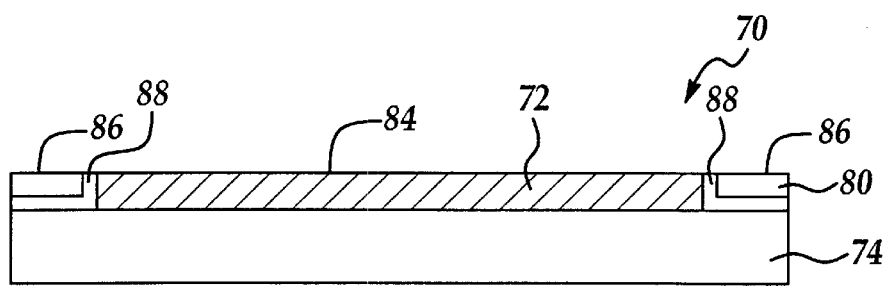
FIG. 5B is a cross-sectional view of the present invention alternate embodiment hybrid mold of FIG. 5 after the face plate, the backing plate and the frame member are bonded together by an adhesive.

In a first alternate embodiment, as shown in FIGS. 5, 5A and 5B, a hybrid mold 70 is formed by bonding a silicon face plate 72 to a borosilicate backing plate 74 by a Mallory® bonding method. A Mallory® bonding method is a method for bonding an electrically insulating material to an electrically conductive material. In the method, a high voltage, i.e., of approximately 1000 volts, is applied to an interface formed between two materials which are maintained at approximately 400° C. for producing an ionic exchange at the interface and thus forming a micro-weld. The method is also known as a thermal ionic bonding method.

Another borosilicate glass frame 80 which has a circular hole slightly larger than the diameter of the silicon face plate and slightly thinner than the face plate is first positioned on the leveling fixture 78. The hole diameter provides slight clearance 76 for the silicon face plate 72. The bonded silicon face plate 72/borosilicate backing plate 74 assembly is then turned upside down and placed on the leveling fixture 78 in such a way that the silicon face plate 72 fits within the hole of the glass frame 80. This is shown in FIG. 5A. In this method, the leveling fixture 78 may be provided with a raised plateau 82 which matches the external dimensions of the glass frame 80 and the silicon face plate 74. This allows easy access to the peripheral edge of the assembly for the subsequent application of a liquid polymer.

A vacuum is turned on in the leveling fixture 78 to assure that the top surface 84 of the silicon face plate 74 and the top surface 86 of the glass frame 80 are coplanar. A liquid polymer 88 is then applied around the peripheral edge of the assembly to fill the small gap 76 formed between the thicker silicon face plate 72 and the thinner glass frame 80. Capillary action assures that the polymer fills the gap all the way around the outer edge of the wafer. After curing, the assembly is turned right-side up and the excess polymer around the periphery of the silicon face plate is trimmed off. This is shown in FIG. 5B. A completed hybrid mold 70 having a crystalline silicon face plate 72 encased therein is thus ready for use in a molten solder screening process for forming a multiplicity of solder balls.

The hybrid molds shown in the preferred and in the first alternate embodiment utilize mechanically joined silicon face plate with a borosilicate backing plate (and frames), the resulting composite or hybrid mold plates are mechanically more durable than mold plates that are made of either glass only or of crystalline silicon only. This is an important feature of the present invention since the hybrid molds are normally used in a process which subjects them to high mechanical stresses.

Figure 6:
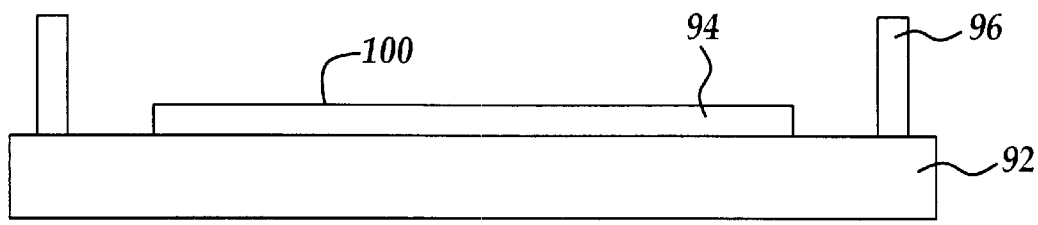
FIG. 6 is a cross-sectional view of a second alternate embodiment of the present invention illustrating a face plate, a frame member for casting and a leveling fixture.
Figure 6A:
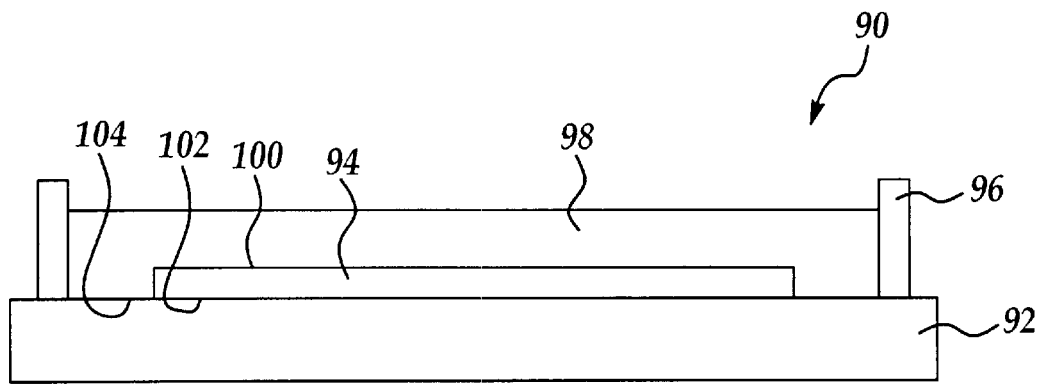
FIG. 6A is a cross-sectional view of the second alternate embodiment of the present invention with an extender material filled into the frame member.
Figure 6B:
FIG. 6B is a cross-sectional view of the present invention second alternate embodiment hybrid mold.

In a second alternate embodiment, as shown in FIGS. 6, 6A and 6B, a hybrid mold 90 is provided in a slightly different construction. In this embodiment, a material is utilized to extend the size of the silicon face plate to accommodate the MSS dispensing head. The material chosen is applied in a liquid state and then solidified. As shown in FIG. 6, a leveling fixture 92 equipped with vacuum is first used to hold down a silicon face plate 94. In the leveling fixture 92, there are no vacuum ports in the region outside the silicon face plate 94. A frame 96 of square shape and approximately 10 inches long is positioned on the leveling fixture 92 as a mold. With the silicon face plate 94 and the frame 96 in place, an extender material 98 is applied to the backside 100 of the silicon face plate 94. This is shown in FIG. 6A. Suitable materials that can be used as the extender material includes borosilicate glass and a variety of polymers. Borosilicate glass can be applied in a molten state and solidified by cooling. In this case, the silicon face plate 94 is preheated by heating fixture 92. This will reduce thermal shock. Polymers can be applied in a liquid state and then solidified by curing techniques which cross-links the polymers. Depending on the adhesion of the extender material to the leveling fixture 92, it may be necessary to apply a release agent to the surface of the leveling fixture 92 prior to the application of the extender material 98.

After solidification of the extender material, the assembly is released from the leveling fixture 92 and then turned right-side up. A present invention hybrid mold 90 which has an absolutely planar construction with the front surface 102 of the silicon face plate 94 and the top surface 104 of the extender material 98 perfectly leveled is thus obtained. The hybrid mold 90 can be used for producing a multiplicity of solder balls in a molten solder screening process.

The present invention novel hybrid mold and method for manufacturing have been amply demonstrated in the above descriptions and in the appended drawings of FIGS. 2A–6B. Numerous benefits are achieved by the present invention novel hybrid molds, for instance, a better control and high precision of mold cavity volumes; a lower defect density than mold constructed with only borosilicate glass; a precise centering of the reflowed solder balls in the pyramidal shaped mold cavities; significantly protruding solder balls during the reflow process which assures bonding pad wetting; a perfect CTE match between the electronic silicon wafer and the mold silicon face plate; a strong optical contrast between filled and unfilled holes enhances inspection; infra-red transparency of mold silicon which permits visual alignment for solder ball transfer; planarity of the hybrid molds constructed by utilizing top referencing; and the mechanical durability of the hybrid molds when compared to a glass-only or a silicon-only mold plate.

While the present invention has been described in an illustrative manner, it should be understood that the terminology used is intended to be in a nature of words of description rather than a limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows:

1. A hybrid mold for a multiplicity of solder balls comprising:
    a crystalline silicon face plate having a substantially parallel front surface and back surface,
    a multiplicity of pyramidal-shaped cavities formed along a crystallographic orientation in said front surface of the face plate, and
    a backing plate having a top surface and a bottom surface, said top surface having a recess formed therein for receiving said face plate by adhesive means such that said front surface of the face plate and said top surface of the backing plate are substantially coplanar.

2. A hybrid mold for a multiplicity of solder balls according to claim 1, wherein said multiplicity of cavities for forming solder balls are formed along a preselected crystallographic orientation of <100>.

3. A hybrid mold for a multiplicity of solder balls according to claim 1, wherein said recess in said top surface of the backing plate having an area and a depth sufficiently large for receiving said face plate.

4. A hybrid mold for a multiplicity of solder balls according to claim 1, wherein said recess in said top surface of the backing plate having an area and a depth sufficiently large for receiving said face plate such that said front surface of the face plate and said top surface of the backing plate are coplanar when said face plate is bonded to said recess by an adhesive layer.

5. A hybrid mold for a multiplicity of solder balls according to claim 1, wherein said backing plate is formed of a material that has a rigidity and coefficient of thermal expansion substantially similar to those for crystalline silicon.

6. A hybrid mold for a multiplicity of solder balls according to claim 1, wherein said backing plate is formed of borosilicate glass.

7. A hybrid mold for a multiplicity of solder balls comprising:
    a crystalline silicon face plate having a first diameter and a multiplicity of cavities formed in a front surface,
    a backing plate having a top surface bonded to a back surface of said face plate, said backing plate having a length and a width larger than said first diameter of the face plate,
    a frame member having substantially the same length and width as the backing plate and an aperture having a second diameter larger than said first diameter of the face plate, and
    an adhesive circumferentially bonding said frame member to said face plate such that a top surface of the frame member being coplanar with said front surface of the face plate.

8. A hybrid mold for a multiplicity of solder balls according to claim 7 further comprising an adhesive layer between a bottom surface of said frame member and a top surface of said backing plate.

9. A hybrid mold for a multiplicity of solder balls according to claim 7, wherein said frame member and said backing plate are formed substantially of the same material.

10. A hybrid mold for a multiplicity of solder balls according to claim 7, wherein said frame member and said backing plate are formed of a material having a rigidity substantially similar to the rigidity of crystalline silicon.

11. A hybrid mold for a multiplicity of solder balls according to claim 7, wherein said frame member and said backing plate are formed of a material having a coefficient of thermal expansion within 50% of that for the crystalline silicon.

12. A hybrid mold for a multiplicity of solder balls according to claim 7, wherein a thermal ionic bond exits between the top surface of the backing plate and the back surface of the face plate.

13. A hybrid mold for a multiplicity of solder balls according to claim 7, wherein said multiplicity of cavities are formed in said crystalline silicon along a crystallographic orientation of <100>.

14. A hybrid mold for a multiplicity of solder balls according to claim 7, wherein each of said multiplicity of cavities are formed in a pyramidal shape.

15. A hybrid mold for a multiplicity of solder balls comprising:
    a crystalline silicon face plate having a multiplicity of pyramidal-shaped cavities formed along a crystallographic orientation in a front surface, and
    a backing plate encasing said face plate and with said front surface of the face plate exposed on a top surface of the backing plate being substantially coplanar with said front surface of the face plate.

16. A hybrid mold for a multiplicity of solder balls according to claim 15, wherein said backing plate being formed of a material that has a rigidity substantially similar to that of the crystalline silicon.

17. A hybrid mold for a multiplicity of solder balls according to claim 15, wherein said backing plate being formed of a material that has a coefficient of thermal expansion substantially similar to that of the crystalline silicon.

18. A hybrid mold for a multiplicity of solder balls according to claim 15, wherein said multiplicity of cavities are formed in said crystalline silicon along a crystallographic orientation of <100>.

19. A hybrid mold for a multiplicity of solder balls according to claim 15, wherein said backing plate is formed of borosilicate glass.

20. A hybrid mold for a multiplicity of solder balls according to claim 15, wherein said backing plate is formed of a polymeric material.

21. A method for preparing a hybrid mold for a multiplicity of solder balls comprising the steps of:

providing a crystalline silicon face plate having a substantially parallel front surface and back surface, etching a multiplicity of cavities for forming solder balls in said front surface of the face plate, providing a backing plate having a top surface and a bottom surface, said top surface having a recess formed therein, and bonding said back surface of the face plate into the recess such that said front surface of the face plate and said top surface of the backing plate are substantially coplanar.

22. A method for preparing a hybrid mold for a multiplicity of solder balls according to claim 21 further comprising the step of forming said multiplicity of cavities in said front surface of the face plate along a preselected crystallographic orientation of <100>.

23. A method for preparing a hybrid mold for a multiplicity of solder balls according to claim 21 further comprising the step of etching said multiplicity of cavities in a pyramidal shape.

24. A method for preparing a hybrid mold for a multiplicity of solder balls according to claim 21 further comprising step of providing said recess in the top surface of the backing plate with an area and a depth sufficient for receiving said face plate.

25. A method for preparing a hybrid mold for a multiplicity of solder balls according to claim 21 further comprising the step of forming said backing plate with a material that has a rigidity and coefficient of thermal expansion substantially similar to those for crystalline silicon.

26. A method for preparing a hybrid mold for a multiplicity of solder balls according to claim 21 further comprising the step of forming said backing plate with borosilicate glass.

27. A method for preparing a hybrid mold for a multiplicity of solder balls comprising the steps of:

providing a crystalline silicon face plate having a first diameter and a multiplicity of cavities formed in a front surface, providing a backing plate having a top surface bonded to a back surface of said face plate, said backing plate having a length and a width larger than said first diameter of said face plate, providing a frame member having substantially the same length and width as the backing plate and an aperture having a second diameter larger than said first diameter of the face plate, and bonding an outer peripheral surface of said face plate to an inner peripheral surface of said frame member by an adhesive means such that a top surface of the frame member is coplanar with the front surface of the face plate.

28. A method for preparing a hybrid mold for a multiplicity of solder balls according to claim 27 further comprising the step of adhesively bonding a bottom surface of the frame member to a top surface of the backing plate.

29. A method for preparing a hybrid mold for a multiplicity of solder balls according to claim 27 further comprising the step of forming said frame member and said backing plate with substantially the same ceramic material.

30. A method for preparing a hybrid mold for a multiplicity of solder balls according to claim 27 further comprising the step of forming said frame member and said backing plate with a material having a rigidity and coefficient of thermal expansion substantially similar to those of crystalline silicon.

31. A method for preparing a hybrid mold for a multiplicity of solder balls according to claim 27 further comprising the step of forming said frame member and said backing plate with a material having a coefficient of thermal expansion within 50% of that for the crystalline silicon.

32. A method for preparing a hybrid mold for a multiplicity of solder balls according to claim 27 further comprising the step of bonding the top surface of the backing plate and the back surface of the face plate by a thermal ionic bonding method.

33. A method for preparing a hybrid mold for a multiplicity of solder balls according to claim 27 further comprising the step of etching a multiplicity of cavities in the front surface of the crystalline silicon face plate along a crystallographic orientation of <100>.

34. A method for preparing a hybrid mold for a multiplicity of solder balls according to claim 27 further comprising the step of etching said multiplicity of cavities in the front surface of the crystalline silicon face plate in a pyramidal shape.

35. A method for preparing a hybrid mold for a multiplicity of solder balls comprising the steps of:

providing a crystalline silicon face plate having a front surface and a back surface, etching a multiplicity of cavities for said solder balls in the front surface, and encasing said face plate with a liquid material forming a backing plate with said front surface of the face plate exposed and a top surface of the backing plate substantially coplanar with the front surface of the face plate.

36. A method for preparing a hybrid mold for a multiplicity of solder balls according to claim 35 further comprising the step of forming said backing plate with a material that has a rigidity after solidifying substantially similar to that of the crystalline silicon.

37. A method for preparing a hybrid mold for a multiplicity of solder balls according to claim 35 further comprising the step of forming said backing plate with a material that has a coefficient of thermal expansion after solidifying substantially similar to that of the crystalline silicon.

38. A method for preparing a hybrid mold for a multiplicity of solder balls according to claim 35 further comprising the step of etching said multiplicity of cavities in the crystalline silicon along a crystallographic orientation of <100>.

39. A method for preparing a hybrid mold for a multiplicity of cavities according to claim 35 further comprising the step of forming said backing plate with borosilicate glass.

40. A method for preparing a hybrid mold for a multiplicity of solder balls according to claim 35 further comprising the step of forming said backing plate with a polymeric material.

* * * * *